United States Patent
Lee et al.

(10) Patent No.: US 9,929,231 B2
(45) Date of Patent: Mar. 27, 2018

(54) ELECTRONIC COMPONENT AND METHOD OF MANUFACTURING THE SAME

(71) Applicant: SAMSUNG ELECTRO-MECHANICS CO., LTD., Suwon-si, Gyeonggi-do (KR)

(72) Inventors: Hai Joon Lee, Suwon-si (KR); Makoto Kosaki, Suwon-si (KR); Ji Hyun Park, Suwon-si (KR); Jong Bong Lim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/251,565

(22) Filed: Aug. 30, 2016

(65) Prior Publication Data

US 2017/0194419 A1 Jul. 6, 2017

(30) Foreign Application Priority Data

Jan. 4, 2016 (KR) .................. 10-2016-0000340

(51) Int. Cl.
  *H01L 49/02* (2006.01)
  *H01L 23/48* (2006.01)
  *H01L 27/01* (2006.01)

(52) U.S. Cl.
  CPC ............ *H01L 28/75* (2013.01); *H01L 23/481* (2013.01); *H01L 27/016* (2013.01);
  (Continued)

(58) Field of Classification Search
  CPC ........ H01G 4/005; H01G 4/008; H01G 4/012; H01G 4/018; H01G 4/06; H01G 4/08;
  (Continued)

(56) References Cited

U.S. PATENT DOCUMENTS

| | | | |
|---|---|---|---|
| 6,320,738 B1 * | 11/2001 | Yamana ................... | H01C 1/14 29/25.41 |
| 8,644,936 B2 * | 2/2014 | Iyer ......................... | H01G 4/35 333/182 |

(Continued)

FOREIGN PATENT DOCUMENTS

| JP | 1994-005459 A | 1/1994 |
|---|---|---|
| JP | 2010-087499 A | 4/2010 |

(Continued)

OTHER PUBLICATIONS

Korean Office Action dated Mar. 1, 2017, issued in Korean Patent Application No. 10-2016-0000340. (w/ English translation).

*Primary Examiner* — Scott B Geyer
(74) *Attorney, Agent, or Firm* — McDermott Will & Emery LLP

(57) ABSTRACT

An electronic component includes a body part and a via part. The body part includes first and second metal layers disposed with at least one dielectric layer interposed therebetween. The via part is disposed in the body part and includes first and second vias penetrating through the body part and selectively connected to the first and second metal layers, respectively. The first and second metal layers contain different metals. In some examples, a first insulating film is disposed between the first metal layer and the second via to electrically insulate the second via from the first metal layer, and a second insulating film is disposed between the second metal layer and the first via to electrically insulate the first via from the second metal layer. A method for forming the electronic component includes use of first and second etchants to selectively etch the first and second metal layers.

12 Claims, 16 Drawing Sheets

(52) U.S. Cl.
CPC  *H01L 2224/16225* (2013.01); *H01L 2224/18* (2013.01); *H01L 2924/15192* (2013.01); *H01L 2924/19105* (2013.01)

(58) Field of Classification Search
CPC .......... H01G 4/10; H01G 4/12; H01G 4/1218; H01G 4/232; H01G 4/30; H01G 4/2325; H01G 4/236; H01L 28/75; H01L 23/481; H01L 27/016; H01L 41/047; H01L 41/0471; H01L 41/0474; H01L 41/0477; H01L 41/083; H01L 41/18; H01L 41/1871

See application file for complete search history.

(56) References Cited

U.S. PATENT DOCUMENTS

| | | | | |
|---|---|---|---|---|
| 2007/0102805 A1* | 5/2007 | Kim | ...... | H01G 4/232 257/698 |
| 2007/0134985 A1* | 6/2007 | Frysz | ...... | H01G 4/232 439/620.09 |
| 2010/0128411 A1* | 5/2010 | Onishi | ...... | H01G 4/30 361/302 |
| 2010/0181285 A1 | 7/2010 | Tanaka | | |
| 2011/0193194 A1* | 8/2011 | Takahashi | ...... | H01G 4/008 257/532 |
| 2012/0018205 A1* | 1/2012 | Sato | ...... | H01C 1/14 174/260 |
| 2013/0094120 A1* | 4/2013 | Sasajima | ...... | H01L 27/016 361/305 |
| 2014/0319974 A1* | 10/2014 | Feichtinger | ...... | H01G 4/30 310/365 |
| 2015/0155097 A1 | 6/2015 | Kim et al. | | |
| 2015/0295160 A1* | 10/2015 | Oshima | ...... | B32B 18/00 347/68 |
| 2015/0368162 A1* | 12/2015 | Hayashi | ...... | B41J 2/14233 252/62.9 PZ |
| 2016/0072228 A1* | 3/2016 | Shih | ...... | H01G 4/30 439/620.21 |

FOREIGN PATENT DOCUMENTS

| | | |
|---|---|---|
| JP | 2010-109014 A | 5/2010 |
| KR | 10-2014-0011765 A | 1/2014 |
| KR | 10-2015-0064522 A | 6/2015 |

* cited by examiner

ELECTRONIC COMPONENT AND METHOD OF MANUFACTURING THE SAME

CROSS-REFERENCE TO RELATED APPLICATION(S)

This application claims benefit of priority to Korean Patent Application No. 10-2016-0000340 filed on Jan. 4, 2016 in the Korean Intellectual Property Office, the disclosure of which is incorporated herein by reference in its entirety.

BACKGROUND

1. Field

The present disclosure relates to an electronic component and a method of manufacturing the same.

2. Description of Related Art

Small electronic components such as capacitors, inductors, piezoelectric elements, varistors, thermistors, and the like, generally include a body formed of a dielectric material, internal electrodes disposed within the body, and external electrodes disposed on surfaces of the body so as to be connected to the internal electrodes. Among such electronic components, capacitors have been widely used as electronic components in mobile communications devices such as computers, personal digital assistants (PDA), cellular phones, and the like, due to advantages thereof such as small size, high capacitance, ease of mounting, and the like.

Recently, a technology (a surface-mounting technology (SMT)) for surface-mounting a small electronic component on a circuit board in a limited amount of space and a technology for embedding a small electronic component in a circuit board have been actively developed. To this end, a technology for significantly reducing sizes and thicknesses of electronic components while maintaining existing levels of performance thereof has been demanded.

SUMMARY

An aspect of the present disclosure may provide a novel electronic component having a significantly reduced size and thickness while maintaining an existing level of component performance, and a method of manufacturing the same.

An aspect of the present disclosure may provide an electronic component in which a plurality of metal layers containing different materials are disposed with respective dielectric layers interposed therebetween. A plurality of vias are selectively connected to the plurality of metal layers and are used as units connecting the plurality of metal layers to external electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, the present disclosure will be described with reference to the accompanying drawings. In the accompanying drawings, shapes, sizes, and the like, of components, may be exaggerated or reduced in size for clarity.

Meanwhile, an electronic component will be described on the basis of an illustrative structure of a thin film capacitor for convenience of explanation, but the present disclosure is not limited thereto. That is, contents of the present disclosure may be applied to other kinds of small electronic components such as capacitors, inductors, piezoelectric elements, varistors, thermistors, or the like, that may be mounted on or embedded in a circuit board, or the like.

Figure 1:
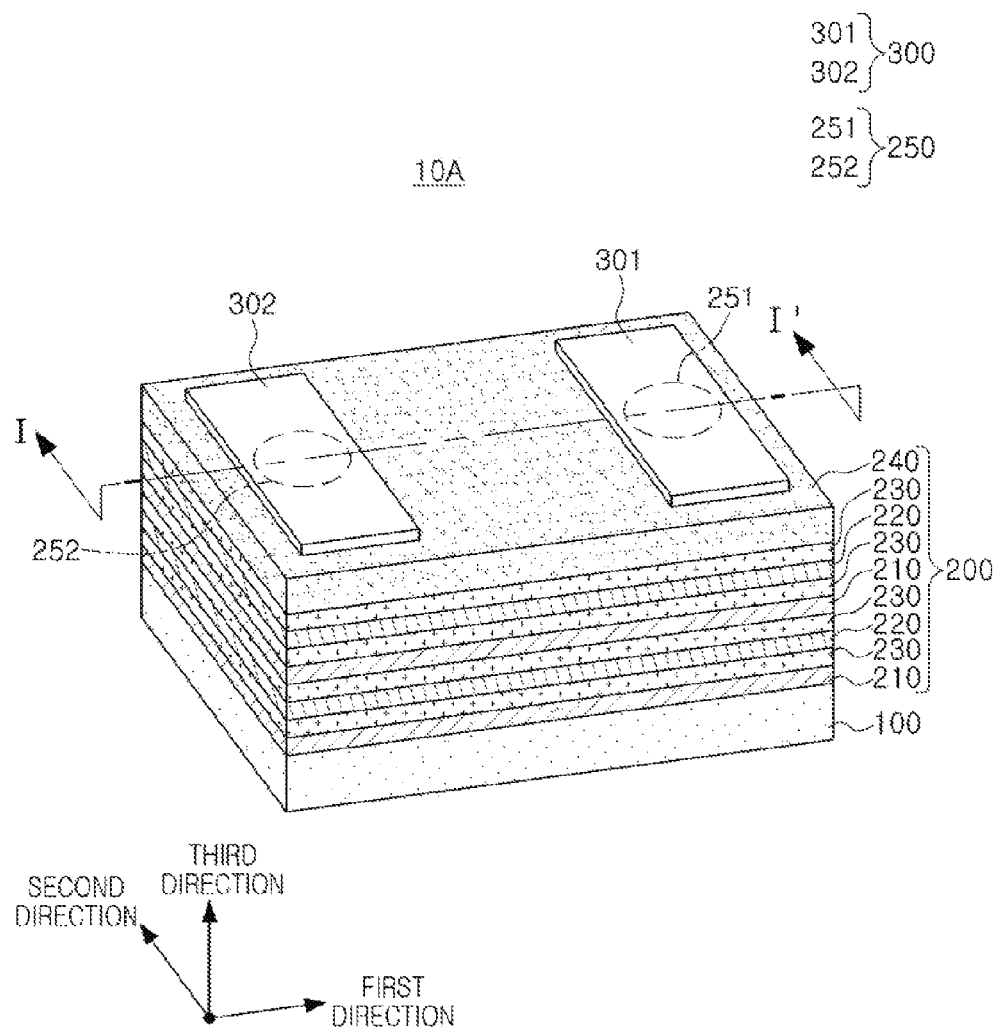
FIG. 1 is a perspective view schematically illustrating an electronic component according to an example.

FIG. 1 is a perspective view schematically illustrating an electronic component according to an example.

Figure 2:
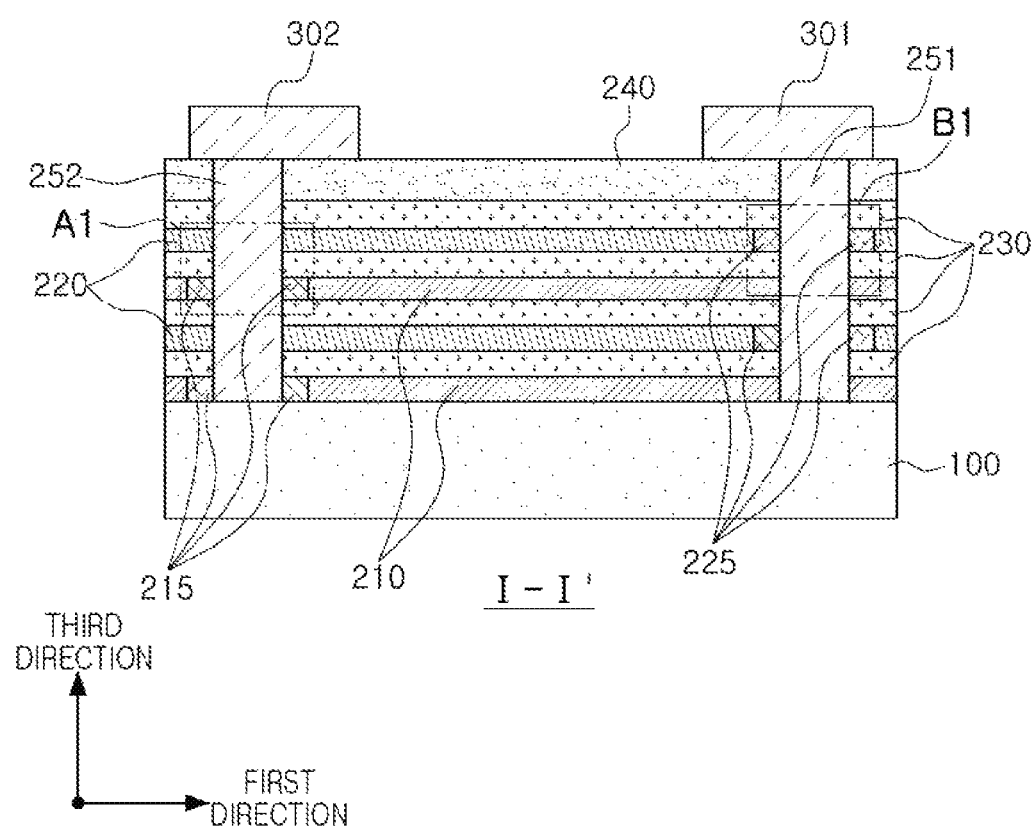
FIG. 2 is a schematic cross-sectional view of the electronic component of FIG. 1 taken along line I-I'.

FIG. 2 is a schematic cross-sectional view of the electronic component of FIG. 1 taken along line I-I'.

Figure 3:
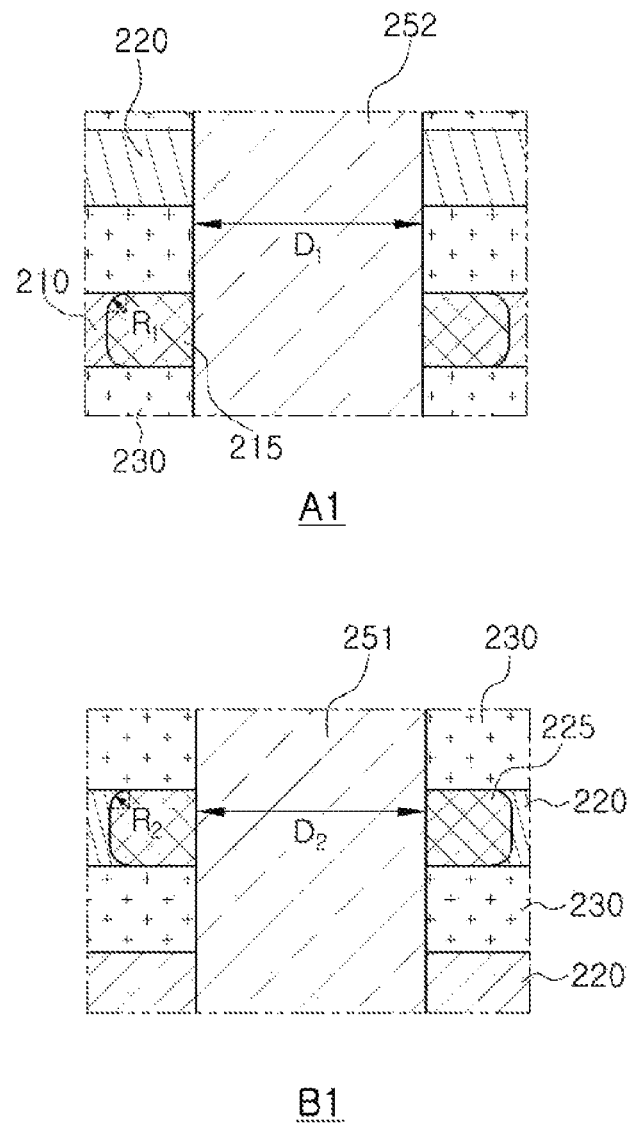
FIG. 3 is a schematic enlarged cross-sectional view of region A1 and region B1 of the electronic component of FIG. 2.

FIG. 3 is a schematic enlarged cross-sectional view of region A1 and region B1 of the electronic component of FIG. 2.

Referring to FIGS. 1 through 3, an electronic component 10A according to an example may include a body part 200 including dielectric layers 230, and first and second metal layers 210 and 220 disposed with respective dielectric layers 230 interposed therebetween; a via part 250 disposed in the body part 200 and including first and second vias 251 and 252 penetrating through the body part 200 and selectively connected to the first and second metal layers 210 and 220, respectively; and an electrode part 300 disposed on the body part 200 and including first and second external electrodes 301 and 302 connected to the first and second vias 251 and 252, respectively. Here, the first metal layer 210 and the second metal layer 220 may contain different metals.

Generally, electronic components, for example, small electronic components such as capacitors, inductors, piezoelectric elements, varistors, thermistors and the like, include a body formed of a dielectric material, internal electrodes disposed in the body, and external electrodes disposed on surfaces of the body so as to be connected to the internal electrodes, as described above. The internal electrodes are generally alternately led out through two or more different surfaces of the body with respective layers of the dielectric material interposed therebetween, and the external electrodes are disposed on external surfaces of the body so as to be connected to respective internal electrodes that are alternately led out.

However, in a small electronic component having such a structure, a process of patterning the respective internal electrodes on dielectric layers is generally required before the internal electrodes and the dielectric layers are stacked together. In this case, the respective internal electrodes may need to be led out to the outside and be then formed using a photolithography or a shadow mask. That is, a process may be complicated, and a process cost may be slightly excessive.

In addition, in the small electronic component having the structure described above, the internal electrodes are generally alternately led out through two or more different surfaces of the body with respective layers of the dielectric material interposed therebetween, and the external electrodes are disposed on external surfaces of the body so as to be respectively connected to the internal electrodes that are alternately led out, such that stress applied to the external electrodes may be concentrated in one direction. Therefore, interface delamination may occur between the internal electrodes and the external electrodes.

On the other hand, in the electronic component according to the example as shown in FIGS. 1 through 3 (e.g., the illustrative thin film capacitor), vias may be formed after the metal layers and the dielectric layers are formed together without performing a separate patterning process, thereby electrically connecting the metal layers and the external electrodes to each other. As a result, the respective internal electrodes do not need to be drawn out to the outside and be then formed using a photolithography or a shadow mask. In addition, since a separate process of processing side surfaces of the body is not required, a process in a wafer unit rather than a chip unit is possible. Therefore, a manufacturing process may be simpler, and process costs may be reduced.

Further, in the electronic component according to the example (e.g., the illustrative thin film capacitor), since the metal layers formed of heterogeneous materials may be connected to each other by one via, the metal layers used as the internal electrodes may be connected to the external electrodes through the via. As described below, a size or a number of vias may be adjusted, if necessary. A degree of freedom of a design of an inner portion of the body may be adjusted to be very high. For example, equivalent series resistance (ESR) may be adjusted through the adjustment of the size or the number of vias.

Further, in the electronic component according to an example (e.g., the illustrative thin film capacitor), since the metal layers used as the internal electrodes are connected to the external electrodes through the vias formed in the body, stress applied to the external electrodes is not concentrated in one direction, but may be dispersed. Therefore, delamination at the interface between the metal layers and the external electrodes may be prevented.

Hereinafter, the respective components constituting the electronic component according to the example will be described in more detail with reference to FIGS. 1 through 3.

The body part 200 may provide a basic shape of the electronic component 10A. A shape of the body part 200 is not limited, but may be, for example, an approximately a hexahedral shape as illustrated in FIG. 1. For example, the body part 200 may have first and second surfaces (e.g., end surfaces) opposing each other in a first direction, third and fourth surfaces (e.g., side surfaces) opposing each other in a second direction and connecting the first and second surfaces to each other, and fifth and sixth surfaces (e.g., top and bottom surfaces) opposing each other in a third direction and connecting the first and second surfaces to each other. In some examples, the body part 200 may not have a hexahedral shape having entirely straight lines due to sintering shrinkage of a material of the body part 200 in a sintering process, and/or corner portions of the body part 200 may be rounded notably in cases in which a process of polishing the corner portions of the body part 200 is performed if necessary. However, in general, the body part 200 may have a substantially hexahedral shape.

The body part 200 may include a plurality of metal layers 210 and 220 and a plurality of dielectric layers 230 disposed between the plurality of metal layers 210 and 220. The plurality of metal layers 210 and 220 may include the first and second metal layers 210 and 220 containing different metals from each other. The first and second metal layers 210 and 220 may be alternately stacked with respective dielectric layers 230 interposed therebetween. The plurality of dielectric layers 230 may be disposed between the first and second metal layers 210 and 220, but are not limited thereto. That is, the plurality of dielectric layers 230 may also be disposed beneath the first (e.g., bottom-most) metal layers 210 or on the second (e.g., top-most) metal layers 220. The numbers of metal layers 210 and 220 and of dielectric layers 230 are not limited, but may be changed depending on design particulars. Furthermore, thicknesses of the plurality of metal layers 210 and 220 and of the plurality of dielectric layers 230 may be changed depending on design particulars.

The plurality of metal layers 210 and 220 constituting the body part 200 may serve as the internal electrodes of the electronic component. The plurality of metal layers 210 and 220 may include the first and second metal layers 210 and 220 containing different metals. As shown in FIG. 1, the first and second metal layers 210 and 220 may be overlapped with each other to form capacitance. Voltages having opposite polarities may be applied to the first and second metal layers 210 and 220 through the first and second external electrodes 301 and 302, respectively. Metals of the first and second metal layers 210 and 220 may need to be different from each other in order to selectively etch the first and second metal layers 210 and 220 in a process to be described below. A combination of metals that may be used in the first and second metal layers 210 and 220 may be any combination as long as the first and second metal layers 210 and 220 may be selectively etched.

Various examples of the combination of metals that may be used in the first and second metal layers 210 and 220 are shown in Table 1. In a case of using these combinations of metals, it may be easy to selectively etch the first and second metal layers 210 and 220 to provide via holes for forming the first and second vias 251 and 252. However, the combinations of metals of Table 1 are only examples, and other combinations of metals may be used as long as the first and second metal layers 210 and 220 may be selectively etched. In addition, the first and second metal layers 210 and 220 may further contain metals other than the metals used in the following combinations.

TABLE 1

| First Metal | Second Metal That May Be Combined With First Metal |
|---|---|
| Aluminum (Al) | Copper (Cu) |
| Chromium (Cr) | Copper (Cu), Gold (Au) |
| Copper (Cu) | Aluminum (Al), Chromium (Cr), Nickel (Ni), Titanium (Ti), Tungsten (W) |

TABLE 1-continued

| First Metal | Second Metal That May Be Combined With First Metal |
|---|---|
| Gold (Au) | Chromium (Cr), Titanium (Ti) |
| Nickel (Ni) | Copper (Cu), Titanium (Ti) |
| Titanium (Ti) | Copper (Cu), Gold (Au), Nickel (Ni), Tungsten (W) |
| Tungsten (W) | Copper (Cu), Titanium (Ti) |

The plurality of dielectric layers 230 constituting the body part 200 may contain a ceramic powder having a high dielectric constant k. Here, the ceramic powder may be a barium titanate (BT)-based powder, a strontium barium titanate (SBT)-based powder, or the like, but is not limited thereto. That is, the ceramic powder may also be any other known ceramic powder.

An insulating layer 240 may be formed outermost (e.g., on an uppermost surface) on the body part 200, if necessary. The insulating layer 240 may serve to protect the metal layers 210 and 220 from the outside, and serve to provide a surface and/or patterns for forming the external electrodes 301 and 302. The insulating layer 240 may contain any material including an insulating material, and may contain a photo-imageable dielectric (PID) material in order to use a photolithography method.

The via part 250 includes the first and second vias 251 and 252 penetrating through the body part 200 and selectively connected to the first and second metal layers 210 and 220, respectively, and may be disposed in the body part 200. The first and second vias 251 and 252 may be connected to the first and second external electrodes 301 and 302, respectively. As a result, the first metal layers 210, the first via 251, and the first external electrode 301 may be electrically connected to each other. In addition, the second metal layers 220, the second via 252, and the second external electrode 302 may be electrically connected to each other. The first via 251 may be electrically insulated from the second metal layers 220. The second via 252 may be electrically insulated from the first metal layers 210. As a result, the first metal layers 210, the second via 252, and the second external electrode 302 may be electrically insulated from each other. In addition, the second metal layers 220, the first via 251, and the first external electrode 301 may be electrically insulated from each other. Horizontal cross-sectional shapes of the first and second vias 251 and 252 are not limited (e.g., in a horizontal place extending along the first and second directions shown in FIG. 1), but may be, for example, circular shapes that have approximately the same or different diameters $D_2$ and $D_1$. However, the horizontal cross-sectional shapes of the first and second vias 251 and 252 are not limited thereto and may instead be oval shapes, quadrangular shapes, or the like. The first and second vias 251 and 252 may contain a conductive material, for example, gold (Au), silver (Ag), copper (Cu), platinum (Pt), aluminum (Al), nickel (Ni), tin (Sn), alloys thereof, or the like.

The plurality of metal layers 210 and 220 constituting the body part 200 may be selectively insulated from the plurality of vias 251 and 252 through a plurality of insulating films 215 and 225. For example, the first metal layers 210 may be electrically insulated from the second via 252 by first insulating films 215 disposed between the first metal layers 210 and the second via 252. In addition, the second metal layers 220 may be electrically insulated from the first via 251 by second insulating films 225 disposed between the second metal layers 220 and the first via 251. The first insulating films 215 may be disposed in the same layers as the first metal layers 210, and enclose the second via 252 in the corresponding layers. The second insulating films 225 may be disposed in the same layers as the second metal layers 220, and enclose the first via 251 in the corresponding layers.

A surface of the first insulating film 215 contacting the first metal layer 210 may have a rounded shape. For example, the surface of the first insulating film 215 contacting the first metal layer 210 may have a rounded shape in which a corner thereof has a radius of curvature of approximately $R_1$. A surface of the second insulating film 225 contacting the second metal layer 220 may also have a rounded shape. For example, the surface of the second insulating film 225 contacting the second metal layer 220 may have a rounded shape in which a corner thereof has a radius of curvature of approximately $R_2$. Materials of the first and second insulating films 215 and 225 are not limited, and may be any materials that may perform an insulation function. For example, the materials of the first and second insulating films 215 and 225 may be a known thermosetting resin, for example, an epoxy resin, a polyimide resin, or the like, but are not limited thereto.

The electrode part 300 including the first and second external electrodes 301 and 302 connected to the first and second metal layers 210 and 220 through the first and second vias 251 and 252, respectively, may be disposed on an external surface of the body part 200. The first and second external electrodes 301 and 302 may be disposed on the insulating layer 240 disposed on the uppermost side of the body part 200 so as to be spaced apart from each other, but are not limited thereto. The first and second external electrodes 301 and 302 may contain a conductive material, for example, gold (Au), silver (Ag), copper (Cu), platinum (Pt), aluminum (Al), nickel (Ni), tin (Sn), alloys thereof, or the like, similar to the first and second vias 251 and 252. The first and second external electrodes 301 and 302 may be entirely or partially integrated with the first and second vias 251 and 252 depending on a method of forming the first and second external electrodes 301 and 302. The first and second external electrodes 301 and 302 may include multiple layers. For example, the first and second external electrodes 301 and 302 may include a copper (Cu) layer and a nickel (Ni)/tin (Sn) layer or a copper (Cu) layer, a conductive epoxy resin layer, and a nickel (Ni)/tin (Sn) layer, but are not limited thereto. Meanwhile, the electrode part 300 may be omitted depending on a form in which the electronic component 10A is used in an electronic apparatus. Alternatively, for example, the electrode part 300 may be disposed to cover side surfaces of the body part 200.

A support part 100 supporting the body part 200 may be disposed on an external surface of the body part 200, if necessary. A general substrate 100 may be used as the support part 100. The substrate 100 may be disposed beneath the lowermost side of the body part 200. Since the body part 200 is generally formed of a thin film, the substrate 100 may be used in order to maintain rigidity of the electronic component 10A. A material of the substrate 100 is not limited, but may be a metal, a ceramic material, or a glass material. The substrate 100 may be a silicon wafer for the purpose of mass production.

FIGS. 4 through 7 are schematic views illustrating an example of processes and process steps for manufacturing the electronic component of FIG. 1.

Figure 5:
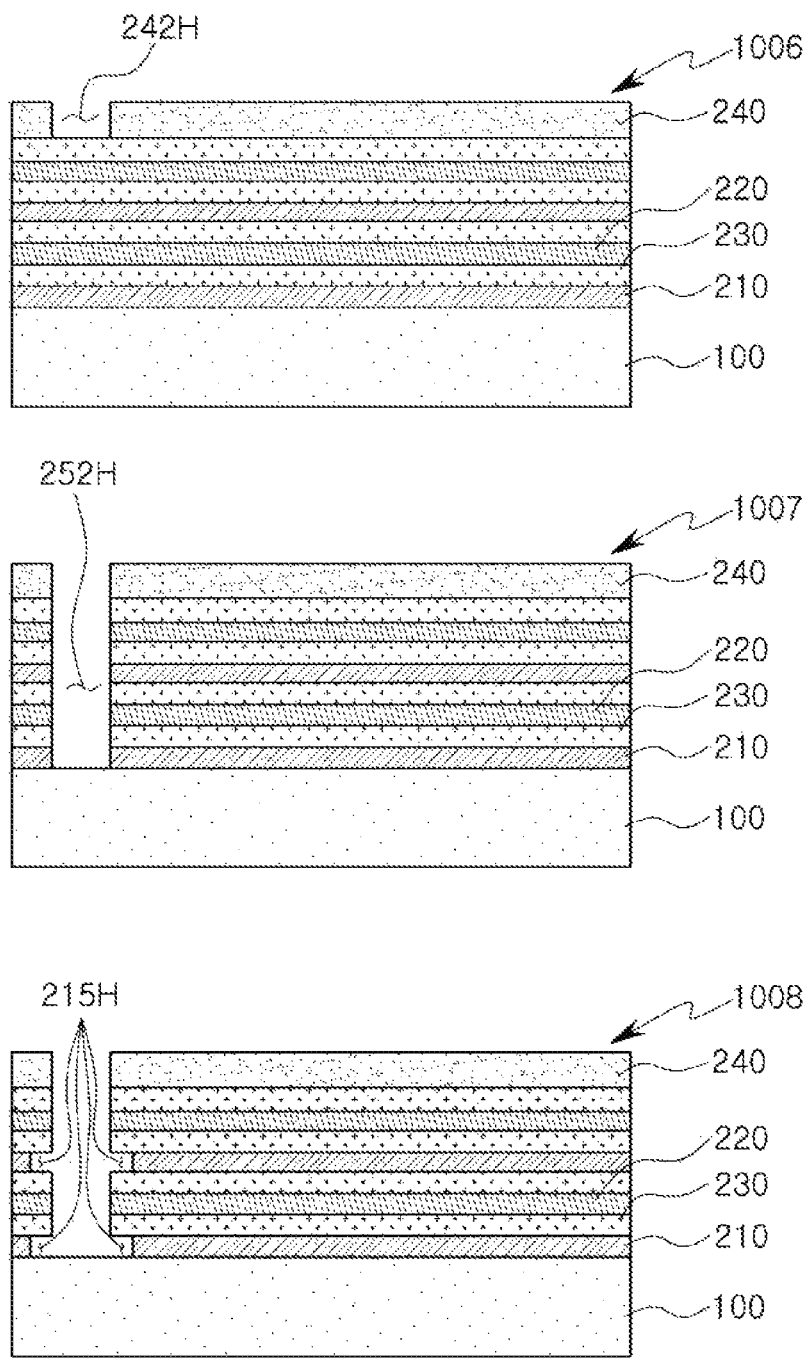
Figure 6:
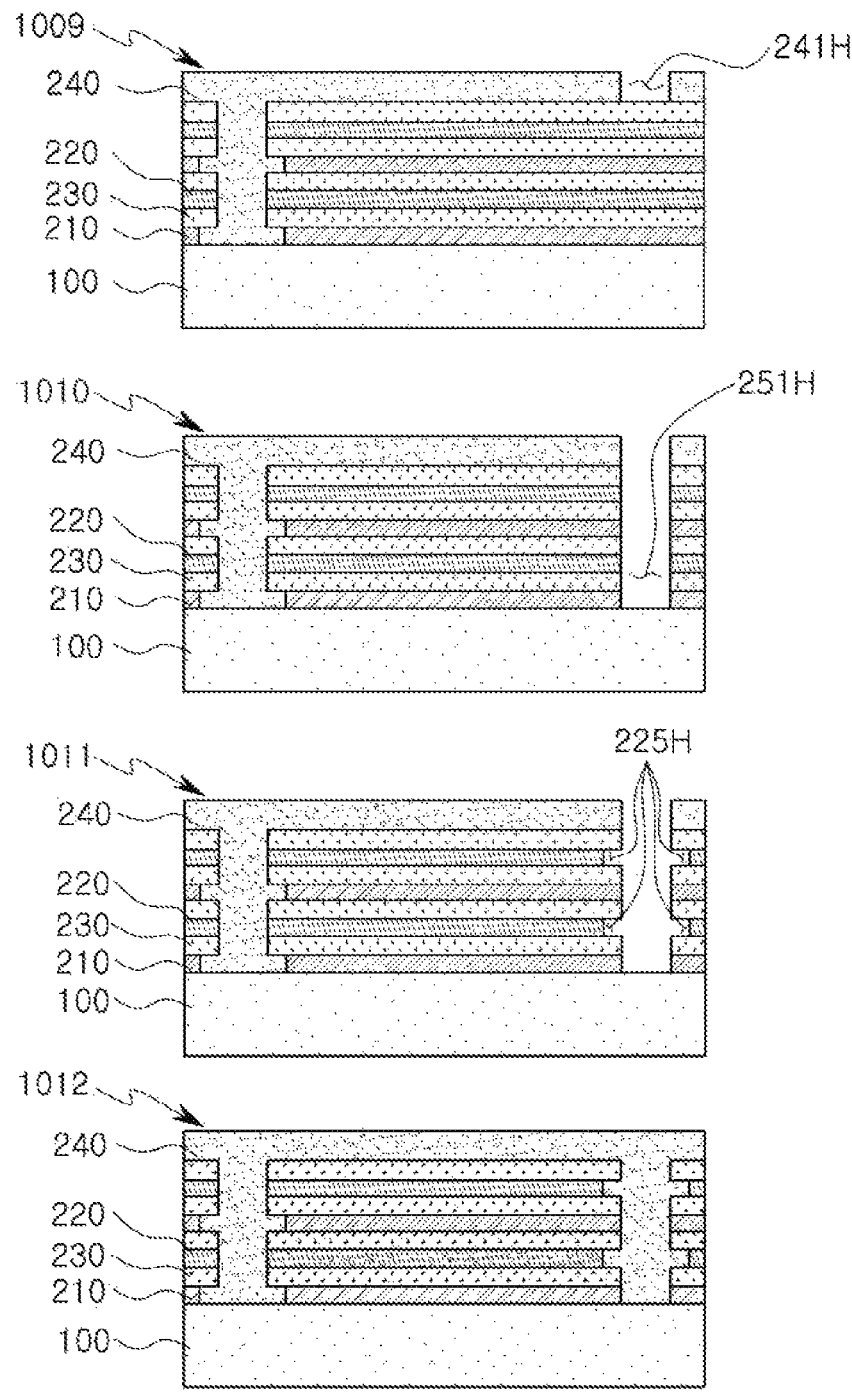
Figure 7:
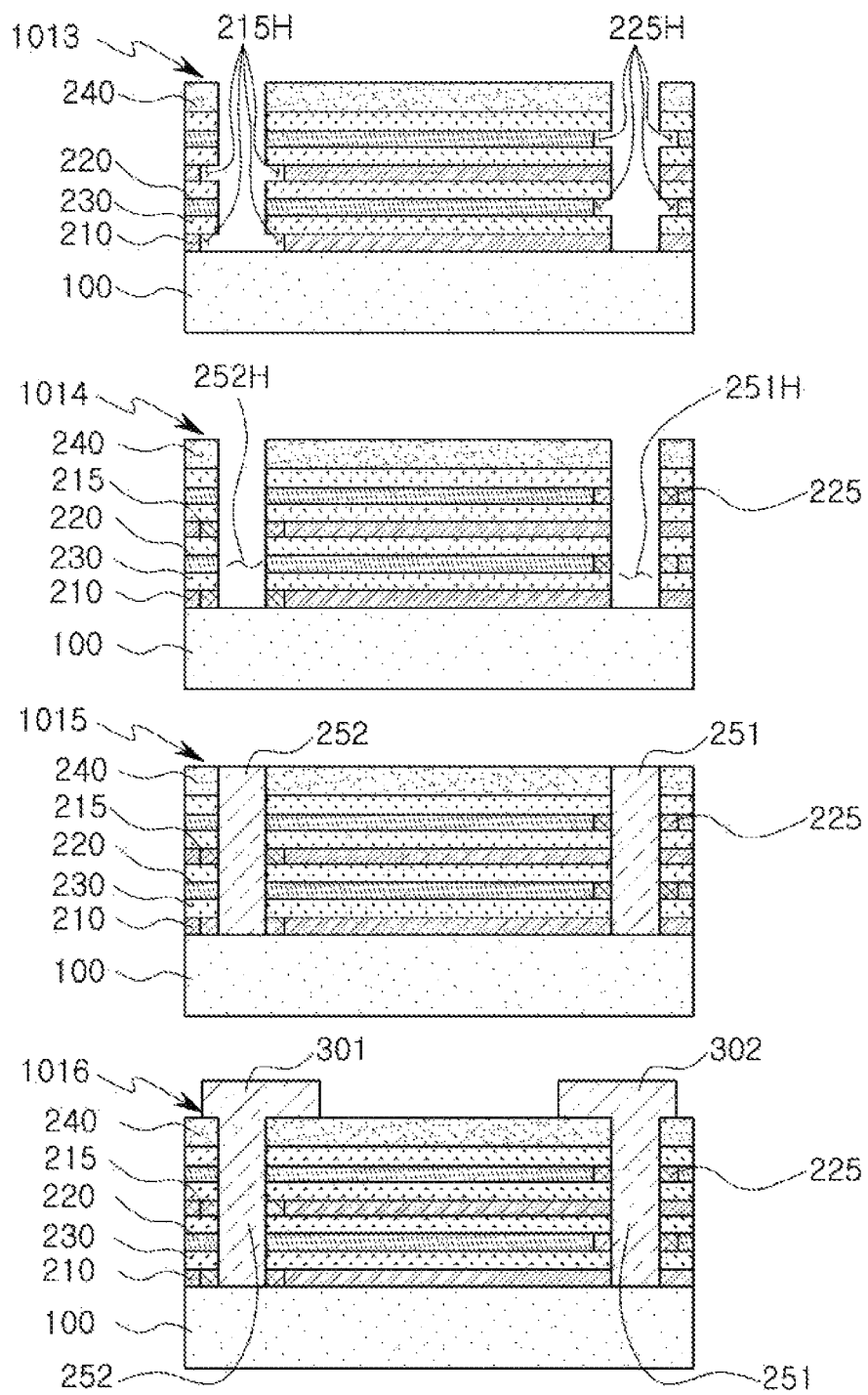

Referring to FIGS. 4 through 7, a method of manufacturing an electronic component 10A according to an example may include sequentially forming the first metal layers 210, the dielectric layers 230, and the second metal layers 220 on the substrate 100 (see, e.g., FIG. 4); forming a second via hole 252H penetrating through the first metal layers 210, the dielectric layers 230, and the second metal layers 220 (see, e.g., FIG. 5); selectively etching only portions of the first metal layers 210 on an inner wall of the second via hole 252H using a first etchant to form first groove parts 215H (see, e.g., FIG. 5); forming a first via hole 251H penetrating through the first metal layers 210, the dielectric layers 230, the second metal layers 220 (see, e.g., FIG. 6); selectively etching only portions of the second metal layers 230 on an inner wall of the first via hole 251H using a second etchant to form second groove parts 225H (see, e.g., FIG. 6); filling the first and second groove parts 215H and 225H with an insulating material to form the first and second insulating films 215 and 225 (see, e.g., FIG. 6); filling the first and second via holes 251H and 252H with a conductive material to form the first and second vias 251 and 252 (see, e.g., FIG. 7); and forming the first and second external electrodes 301 and 302 connected to the first and second vias 251 and 252, respectively (see, e.g., FIG. 7).

Hereinafter, processes constituting the method of manufacturing the electronic component according to the example will be described in more detail with reference to FIGS. 4 through 7, but a description of contents overlapped with contents described above will be omitted.

Figure 4:
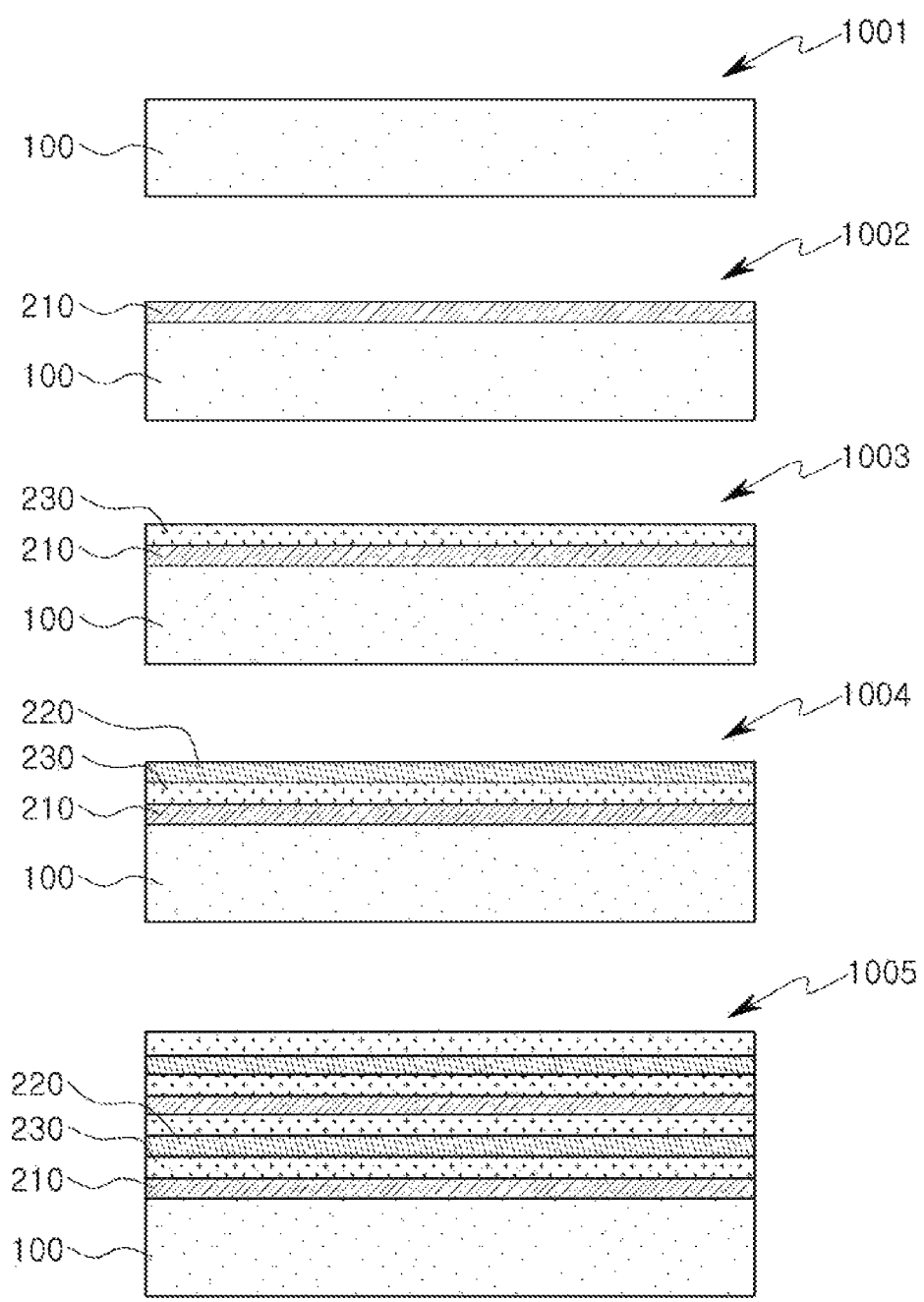
FIGS. 4 through 7 are schematic views illustrating an example of processes of manufacturing the electronic component of FIG. 1.

Referring to process 1001, the substrate 100 may be first prepared as shown in FIG. 4. The substrate 100 may be relatively large, and a plurality of body parts 200 may be simultaneously formed using the substrate 100 having the large size. In examples in which multiple body parts 200 are formed on a substrate 100, the body parts 200 are cut into individual chips after being formed such that a plurality of electronic components 10A may be manufactured in a single process.

Referring to process 1002, the first metal layer 210 may be formed on the substrate 100 as shown in FIG. 4. The first metal layer 210 may be formed by a known deposition process. For example, the first metal layer 210 may be formed using chemical vapor deposition (CVD), physical vapor deposition (PVD), sputtering, or the like, but is not limited thereto.

Referring to process 1003, the dielectric layer 230 may be formed on the first metal layer 210 as shown in FIG. 4. The dielectric layer 230 may be formed by applying a slurry containing ceramic powder to the first metal layer 210 and then drying the slurry. Alternatively, the dielectric layer may be formed by the known deposition process, similar to the first metal layer 210. For example, the dielectric layer 230 may be formed using chemical vapor deposition (CVD), physical vapor deposition (PVD), sputtering, or the like, but is not limited thereto. The dielectric layer 230 may also be formed by applying a slurry containing ceramic powder onto a carrier film, drying the applied slurry to prepare a plurality of separate ceramic green sheets, and then stacking the plurality of separate ceramic green sheets, if necessary.

Referring to process 1004, the second metal layer 220 may be formed on the dielectric layer 230 as shown in FIG. 4. The second metal layer 220 may also be formed by the known deposition process. For example, the second metal layer 220 may be formed using chemical vapor deposition (CVD), physical vapor deposition (PVD), sputtering, or the like, but is not limited thereto.

Referring to process 1005, processes 1002 to 1004 may be appropriately repeated depending on design particulars to form additional first metal layer(s) 210, dielectric layer(s) 230, and second metal layer(s) 220 as shown in FIG. 4. The numbers of first metal layers 210, dielectric layers 230, and second metal layers 220 that are formed may be greater than (or smaller than) those of first metal layers 210, dielectric layers 230, and second metal layers 220 illustrated in FIG. 4, and in some cases, the body part may only be formed using processes 1002 to 1004 without performing process 1005.

Referring to process 1006, the insulating layer 240 may be formed on a layer disposed at the uppermost side among the first metal layers 210, the dielectric layers 230, and the second metal layers 220 of the body part 200, as shown in FIG. 5. The insulating layer 240 may be a photo-resist layer, and a second preliminary hole pattern 242H for forming the second via 252 may be formed in the insulating layer 240 by the known photolithography method, if necessary.

Referring to process 1007, the second via hole 252H penetrating through the first metal layers 210, the dielectric layers 230, and the second metal layers 220 may be formed using the second preliminary hole pattern 242H formed in the insulating layer 240, as shown in FIG. 5. The second via hole 252H may be formed using laser drilling, mechanical drilling, or the like. Alternatively, the second via hole 252H may also be formed using a known etchant that may etch all of the first metal layers 210, the dielectric layers 230, and the second metal layers 220. Alternatively, the second via hole 252H may be formed by other known methods.

Referring to process 1008, portions of the first metal layers 210 adjacent to (or contacting) the inner wall of the second via hole 252H may be etched using the first etchant, as shown in FIG. 5. The first etchant selectively etches only the first metal layers 210 to form the first groove parts 215H. The first groove parts 215H may be formed by removing the first metal layers 210, and surfaces of the first groove parts 215H contacting the first metal layers 210 may have the rounded shape as described above. The second metal layers 220 and the dielectric layers 230 containing metals different from that (or those) of the first metal layers 210 may not be substantially etched by the first etchant in process 1008. That is, an etchant that may etch only the first metal layers 210 (from among the first and second metal layers 210 and 220 and the dielectric layers 230) may be used as the first etchant. More generally, the first etchant may etch the first metal layers 210 at a rate much higher (e.g., 10 times or more) than a rate at which the first etchant etches either of the second metal layers 220 and the dielectric layers 230. The selective etching may be determined by a property of a metal. Therefore, an appropriate etchant sold in the market depending on a combination of the metals used in the first and second metal layers 210 and 220 described above may be used as the first etchant.

Referring to process 1009, the second preliminary hole pattern 242H, the second via hole 252H, and the first groove parts 215H may be filled with a material of the insulating layer 240, as shown in FIG. 6. A first preliminary hole pattern 241H for forming the first via 251 may be formed in the insulating layer 240 by the known photolithography method, if necessary.

Referring to process 1010, the first via hole 251H penetrating through the first metal layers 210, the dielectric layers 230, and the second metal layers 220 may be formed using the first preliminary hole pattern 241H formed in the insulating layer 240, as shown in FIG. 6. The first via hole 251H may be formed using laser drilling, mechanical drilling, or the like. Alternatively, the first via hole 251H may also be formed using the known etchant that may etch all of the first metal layers 210, the dielectric layers 230, and the second metal layers 220. Alternatively, the first via hole 251H may be formed by other known methods.

Referring to process 1011, portions of the second metal layers 220 adjacent to (or contacting) the inner wall of the first via hole 251H may be etched using the second etchant, as shown in FIG. 6. The second etchant selectively etches only the second metal layers 220 to form the second groove parts 225H. The second groove parts 225H may be formed by removing the second metal layers 220, and surfaces of the second groove parts 225H contacting the second metal layers 220 may have the rounded shape as described above. The first metal layers 210 and the dielectric layers 230 containing metals different from that (or those) of the second metal layers 220 may not be substantially etched by the second etchant in process 1011. That is, an etchant that may etch only the second metal layers 220 (from among the first and second metal layers 210 and 220 and the dielectric layers 230) may be used as the second etchant. More generally, the second etchant may etch the second metal layers 220 at a rate much higher (e.g., 10 times or more) than a rate at which the second etchant etches either of the first metal layers 210 and the dielectric layers 230. The selective etching may be determined by a property of a metal. Therefore, an appropriate etchant sold in the market may be used as the second etchant depending on a combination of the metals used in the first and second metal layers 210 and 220 described above.

Referring to process 1012, the first preliminary hole pattern 241H, the first via hole 251H, and the second groove parts 225H may be filled with a material of the insulating layer 240 as shown in FIG. 6. However, this process may be optional, and may be omitted, if necessary.

Referring to process 1013, the material of the insulating layer 240 filled in the first preliminary hole pattern 241H, the second preliminary hole pattern 242H, the first via hole 251H, the second via hole 252H, the first groove parts 215H, and the second groove parts 225H may be removed, as shown in FIG. 7. This process may be performed using the known etchant that may remove only the material of the insulating layer 240.

Referring to process 1014, the first preliminary hole pattern 241H, the second preliminary hole pattern 242H, the first via hole 251H, the second via hole 252H, the first groove parts 215H, and the second groove parts 225H may be coated with an insulating material. In turn, the insulating material filled in the first preliminary hole pattern 241H, the second preliminary hole pattern 242H, the first via hole 251H, and the second via hole 252H may be removed as shown in FIG. 7, and the insulating material filled in the first groove parts 215H and the second groove parts 225H may be hardened to form the first insulating films 215 and the second insulating films 225 respectively filled in the first groove parts 215H and the second groove parts 225H. However, the first insulating films 215 and the second insulating films 225 may also be formed by filling the first groove parts 215H and the second groove parts 225H using other methods.

Referring to the process 1015, the first preliminary hole pattern 241H, the second preliminary hole pattern 242H, the first via hole 251H and the second via hole 252H may be filled with a conductive material to form the first via 251 and the second via 252, as shown in FIG. 7. A method of filling the first preliminary hole pattern 241H, the second preliminary hole pattern 242H, the first via hole 251H, and the second via hole 252H with the conductive material is not limited. That is, the first preliminary hole pattern 241H, the second preliminary hole pattern 242H, the first via hole 251H, and the second via hole 252H may be filled with the conductive material by the known metal paste printing method or the known metal plating method.

Referring to process 1016, the first and second external electrodes 301 and 302 connected to the first and second vias 251 and 252, respectively, may be formed as shown in FIG. 7. The first and second external electrodes 301 and 302 may also be formed by the known metal paste printing method or the known metal plating method. In some cases, the first and second external electrodes 301 and 302 may be formed simultaneously with the first and second vias 251 and 252, but are not limited thereto.

Figure 8:
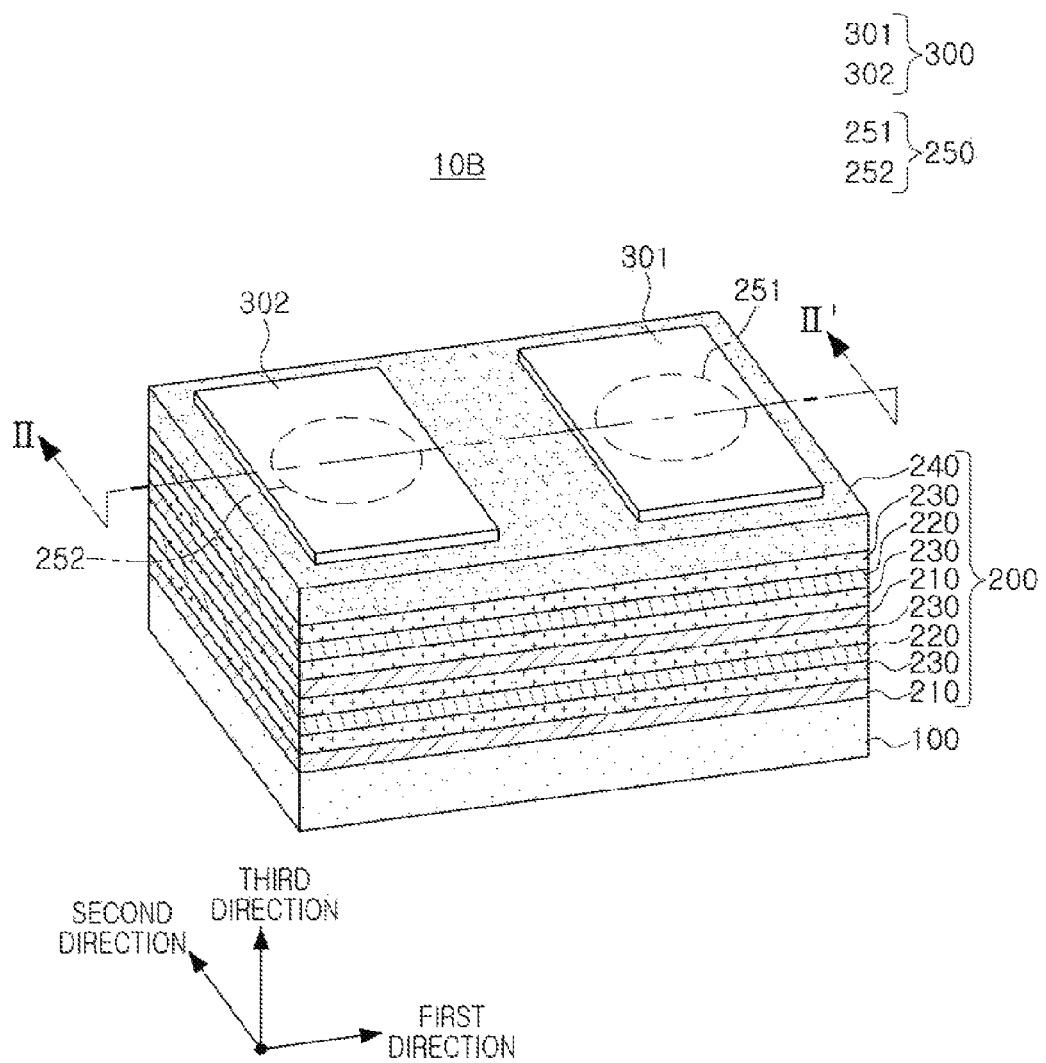
FIG. 8 is a perspective view schematically illustrating an electronic component according to another example.

FIG. 8 is a perspective view schematically illustrating an electronic component according to another example.

Figure 9:
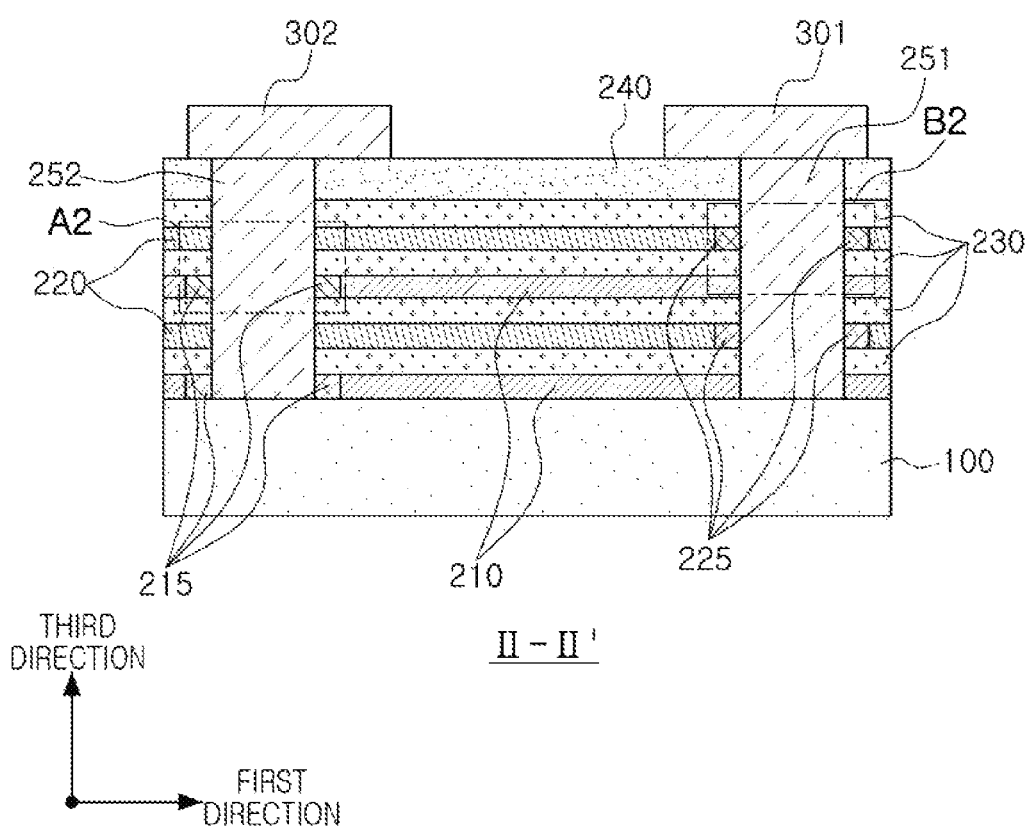
FIG. 9 is a schematic cross-sectional view of the electronic component of FIG. 8 taken along line II-II'.

FIG. 9 is a schematic cross-sectional view of the electronic component of FIG. 8 taken along line II-II'.

Figure 10:
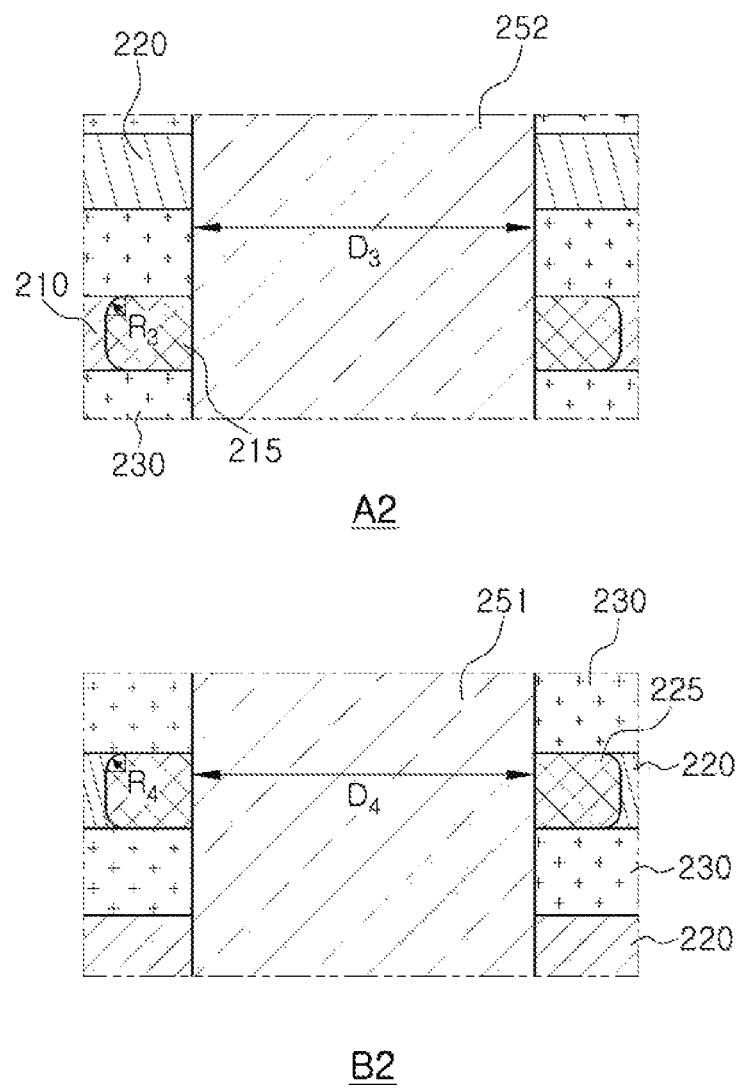
FIG. 10 is a schematic enlarged cross-sectional view of region A2 and region B2 of the electronic component of FIG. 9.

FIG. 10 is a schematic enlarged cross-sectional view of region A2 and region B2 of the electronic component of FIG. 9.

Referring to FIGS. 8 through 10, an electronic component 10B according to another example may include a body part 200 including dielectric layers 230 and first and second metal layers 210 and 220 disposed with respective dielectric layers 230 interposed therebetween; a via part 250 disposed in the body part 200 and including first and second vias 251 and 252 penetrating through the body part 200 and selectively connected to the first and second metal layers 210 and 220, respectively; and an electrode part 300 disposed on the body part 200 and including first and second external electrodes 301 and 302 connected to the first and second vias 251 and 252, respectively. Here, the first metal layer 210 and the second metal layer 220 may contain different metals.

Hereinafter, the respective components constituting the electronic component according to the other example will be described in more detail with reference to FIGS. 8 through 10, and a description of contents overlapped with contents described above will be omitted.

In the electronic components 10A and 10B, equivalent series resistance (ESR) characteristics may be changed depending on sizes of the first and second vias 251 and 252. For example, the first and second vias 251 and 252 of the electronic component 10B according to the other example may respectively have diameters $D_4$ and $D_3$ larger than the diameters $D_2$ and $D_1$ of the first and second vias 251 and 252 of the electronic component 10A. Therefore, equivalent series resistance (ESR) of the electronic component 10B according to the other example may be smaller than that of the electronic component 10A. The reason is that the value of the equivalent series resistance (ESR) tends to vary in inverse proportion to the value of an area of contact surfaces between the internal electrodes and the external electrodes. That is, equivalent series resistance (ESR) tends to be decreased when the area of the contact surfaces is increased. Since contact surfaces between the metal layers 210 and 220 and the vias 251 and 252 may be considered as the contact surfaces between the internal electrodes and the external electrodes in the present examples, equivalent series resistance (ESR) may be adjusted depending on sizes of the vias 251 and 252.

Meanwhile, the larger the area occupied by the vias 251 and 252, the smaller the area in which the first and second metal layers 210 and 220 are overlapped with each other. In consideration of this, sizes of the vias may be appropriately controlled, whereby an inner portion of the body part 200 may be designed. That is, since the metal layers 210 and 220 serving as the internal electrodes are selectively connected to the external electrodes 301 and 302 through the vias 251 and 252 in the electronic component according to the present disclosure, the vias 251 and 252 may be independently designed depending on the numbers of metal layers 210 and 220. Therefore, equivalent series resistance (ESR) may be easily adjusted depending on a desired design numerical value.

A description for other configurations is the same as the description provided above. For example, also in the electronic component 10B according to another example, surfaces of the first and second insulating films 215 and 225 contacting the first and second metal layers 210 and 220 may have a rounded shape. For example, the surfaces of the first and second insulating films 215 and 225 contacting the first and second metal layers 210 and 220 may have a rounded shape in which corners thereof have radii of curvature of approximately $R_3$ and $R_4$.

Since a method of manufacturing the electronic component 10B according to another example is the same as the method of manufacturing the electronic component 10A according to an example described above except that sizes of the vias 251 and 252 are adjusted, a detailed description thereof will be omitted.

Figure 11:
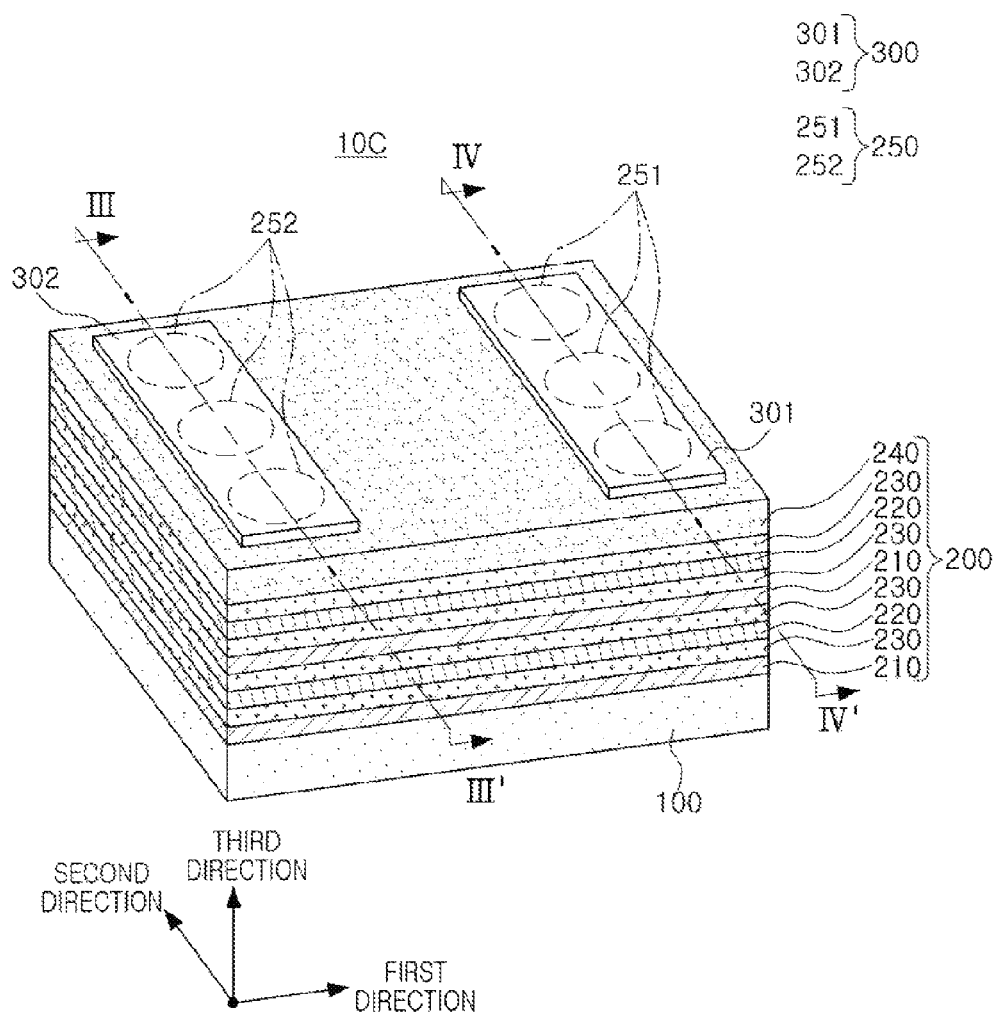
FIG. 11 is a perspective view schematically illustrating an electronic component according to another example.

FIG. 11 is a perspective view schematically illustrating an electronic component according to a further example.

Figure 12:
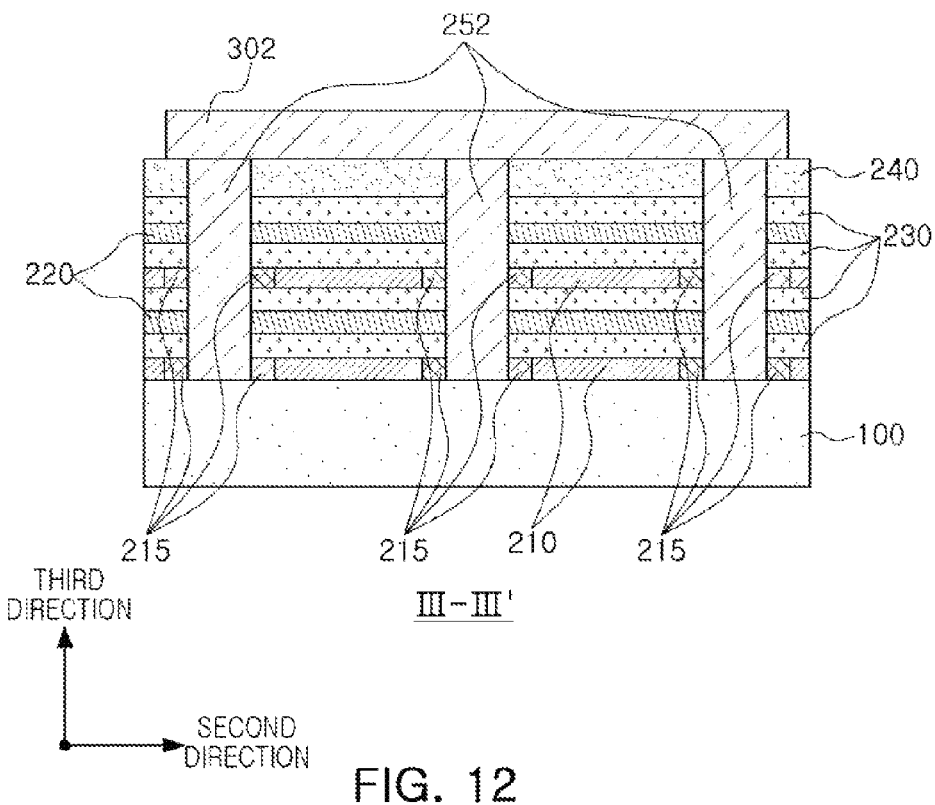
FIG. 12 is a schematic cross-sectional view of the electronic component of FIG. 11 taken along line III-III'.

FIG. 12 is a schematic cross-sectional view of the electronic component of FIG. 11 taken along line III-III'.

Figure 13:
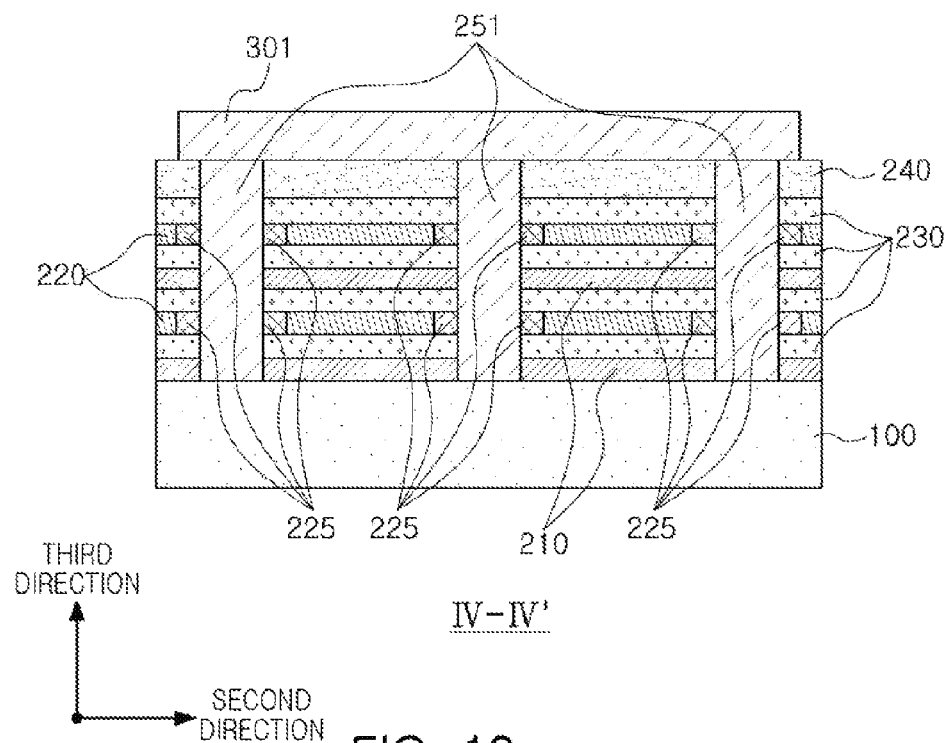
FIG. 13 is a schematic cross-sectional view of the electronic component of FIG. 11 taken along line IV-IV'.

FIG. 13 is a schematic cross-sectional view of the electronic component of FIG. 11 taken along line IV-IV'.

Referring to FIGS. 11 through 13, an electronic component 10C according to another example may include a body part 200 including dielectric layers 230 and first and second metal layers 210 and 220 disposed with respective dielectric layers 230 interposed therebetween; a via part 250 disposed in the body part 200 and including first and second vias 251 and 252 penetrating through the body part 200 and selectively connected to the first and second metal layers 210 and 220, respectively; and an electrode part 300 disposed on the body part 200 and including first and second external electrodes 301 and 302 connected to the first and second vias 251 and 252, respectively. Here, the first metal layer 210 and the second metal layer 220 may contain different metals.

Hereinafter, the respective components constituting the electronic component 10C according to another further example will be described in more detail with reference to FIGS. 11 through 13, and a description of contents overlapped with contents described above will be omitted.

In the electronic components 10A and 10C, equivalent series resistance (ESR) characteristics may also be changed depending on the numbers of first and second vias 251 and 252. For example, the numbers of first and second vias 251 and 252 of the electronic component 10C according to the further example may be more than those of first and second vias 251 and 252 of the electronic component 10A. Therefore, equivalent series resistance (ESR) of the electronic component 10C according to the further example may be lower than that of the electronic component 10A. The reason is that equivalent series resistance (ESR) tends to vary in inverse proportion to an area of contact surfaces between the internal electrodes and the external electrodes, as described above. That is, equivalent series resistance (ESR) tends to be decreased when the area of the contact surfaces is increased. Since contact surfaces between the metal layers 210 and 220 and the vias 251 and 252 may be considered as the contact surfaces between the internal electrodes and the external electrodes, equivalent series resistance (ESR) may vary and be adjusted depending on the numbers of vias 251 and 252.

Meanwhile, the greater the numbers of vias 251 and 252, the smaller the area in which the first and second metal layers 210 and 220 are overlapped with each other. In consideration of this, the numbers of vias may be appropriately controlled, whereby an inner portion of the body part 200 may be designed. That is, as described above, since the metal layers 210 and 220 serving as the internal electrodes are selectively connected to the external electrodes 301 and 302 through the vias 251 and 252 in the electronic component according to the present disclosure, the vias 251 and 252 may be independently designed depending on the numbers of metal layers 210 and 220. Therefore, equivalent series resistance (ESR) may be easily adjusted depending on a desired design numerical value.

Meanwhile, all of a plurality of vias constituting the first via 251 may be selectively connected to the first metal layers 210. That is, second insulating films 225 may be disposed between all of the plurality of vias forming the first via 251 and the second metal layers 220, such that all of the plurality of vias forming the first via 251 may be electrically insulated from the second metal layers 220. Conversely, all of a plurality of vias forming the second via 252 may be selectively connected to the second metal layers 220. That is, first insulating films 215 may be disposed between all of the plurality of vias forming the second via 252 and the first metal layers 210, such that all of the plurality of vias forming the second via 252 may be electrically insulated from the first metal layers 210. As a result, all of the plurality of vias forming the first via 251 may be connected to the first external electrode 301. As a result, the first metal layers 210 may be electrically connected to the first external electrode 301 through various routes. Similarly, all of the plurality of vias constituting the second via 252 may be connected to the second external electrode 302. As a result, the second metal layers 220 may be electrically connected to the second external electrode 302 via various routes.

A description for other configurations is the same as the description provided above. For example, in the electronic component 10C according to another example, surfaces of the first and second insulating films 215 and 225 contacting the first and second metal layers 210 and 220 may also have a rounded shape.

Since a method of manufacturing the electronic component 10C according to the further example is the same as the method of manufacturing the electronic component 10A described above except that the numbers of vias 251 and 252 are adjusted, a detailed description therefor will be omitted.

Figure 14:
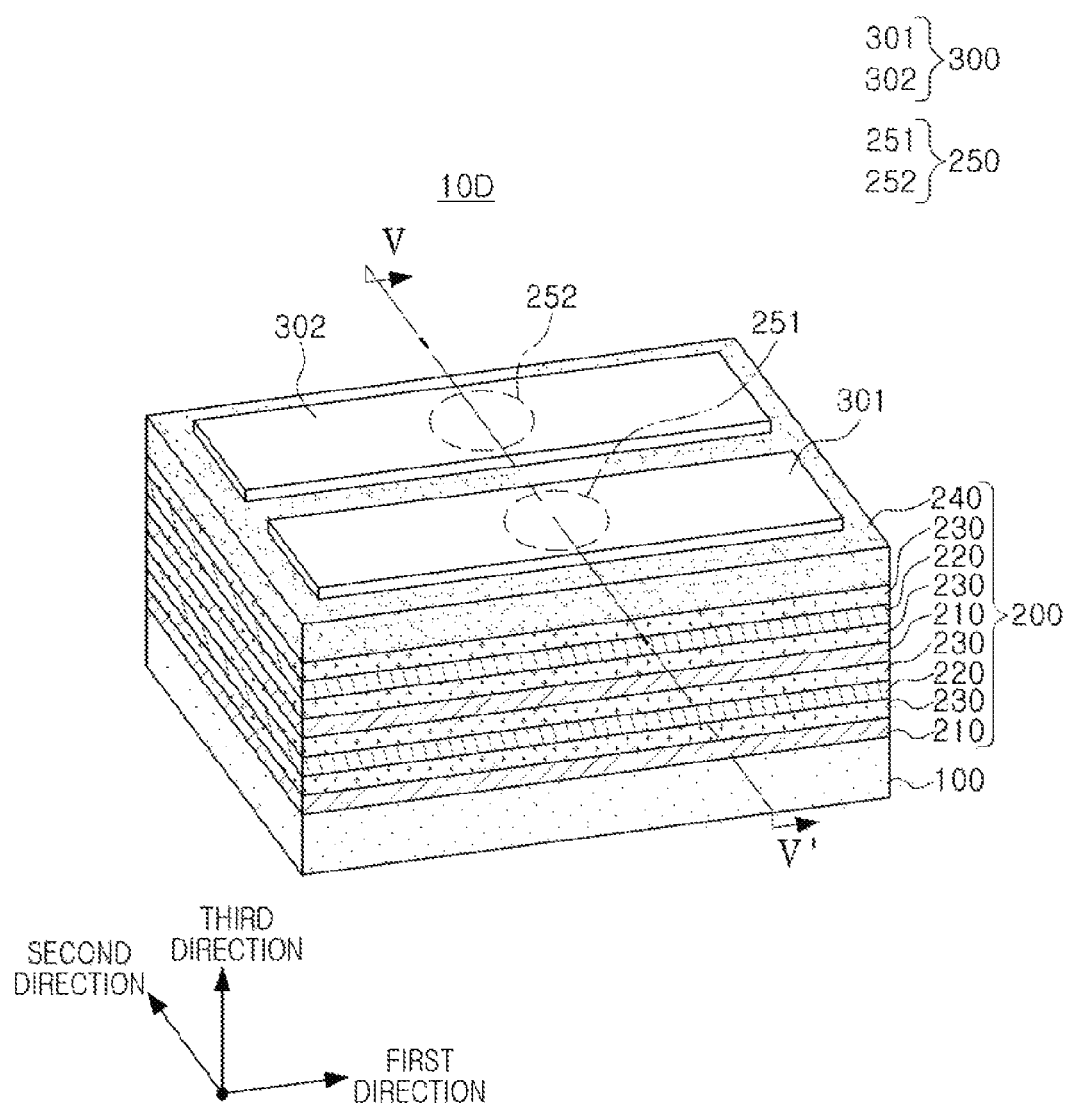
FIG. 14 is a perspective view schematically illustrating an electronic component according to another example.

FIG. 14 is a perspective view schematically illustrating an electronic component according to another example.

Figure 15:
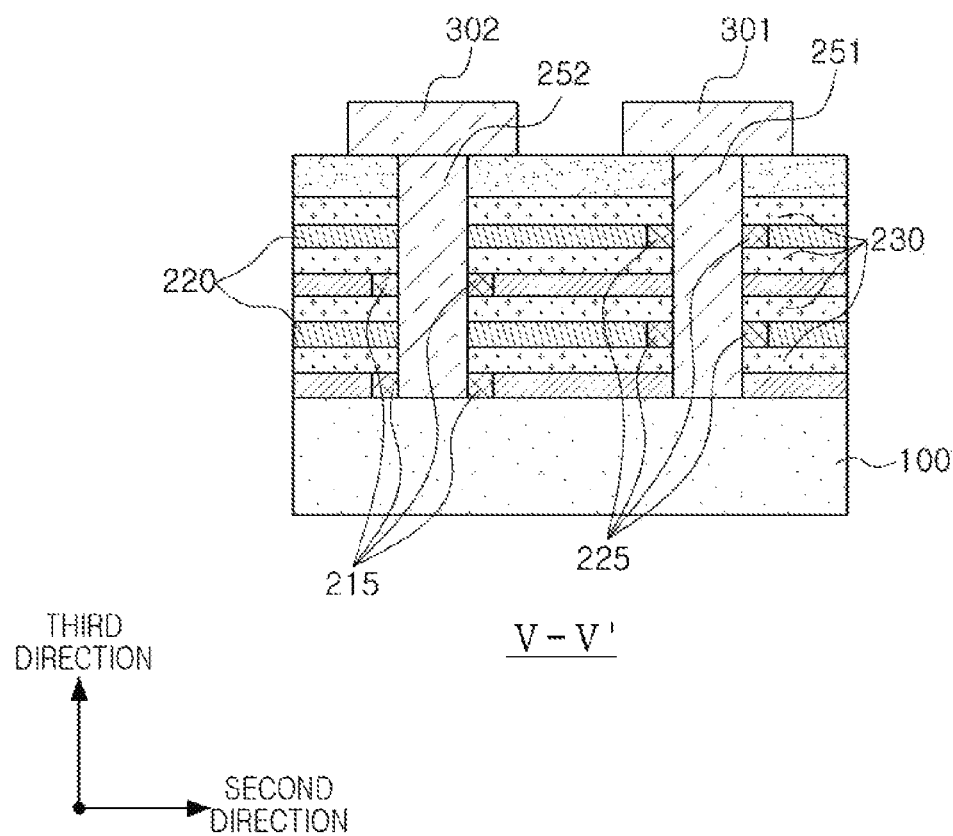
FIG. 15 is a schematic cross-sectional view of the electronic component of FIG. 14 taken along line V-V'.

FIG. 15 is a schematic cross-sectional view of the electronic component of FIG. 14 taken along line V-V'.

Referring to FIGS. 14 and 15, an electronic component 10D according to another example may include a body part 200 including dielectric layers 230 and first and second metal layers 210 and 220 disposed with respective dielectric layers 230 interposed therebetween; a via part 250 disposed in the body part 200 and including first and second vias 251 and 252 penetrating through the body part 200 and selectively connected to the first and second metal layers 210 and 220, respectively; and an electrode part 300 disposed on the body part 200 and including first and second external electrodes 301 and 302 connected to the first and second vias 251 and 252, respectively. Here, the first metal layer 210 and the second metal layer 220 may contain different metals.

Hereinafter, the respective components constituting the electronic component according to the other example will be described in more detail with reference to FIGS. 14 and 15, and a description of contents overlapped with contents described above will be omitted.

In the electronic components 10A through 10D, a disposition of the first and second external electrodes 301 and 302 is not limited. For example, the first and second external electrodes 301 and 302 may be disposed to be spaced apart from each other in a first direction as in the electrode components 10A to 10C. Alternatively, the first and second external electrodes 301 and 302 may be disposed to be spaced apart from each other in a second direction (different from the first direction) as in the electrode component 10D. The disposition of the external electrodes 301 and 302 may be changed, as described above, depending on an internal design, a kind of electronic apparatus in which the electronic component is used, or a form in which the electronic component is used in the electronic apparatus.

A description for other configurations is the same as the description provided above. For example, also in the electronic component 10D according to another example, surfaces of the first and second insulating films 215 and 225 contacting the first and second metal layers 210 and 220 may have a rounded shape. In addition, sizes and/or the number of vias 251 and 252 may also be adjusted.

Since a method of manufacturing the electronic component 10D according to the other example is the same as the method of manufacturing the electronic component 10A according to an example described above except that the disposition of the external electrodes 301 and 302 is adjusted, a detailed description thereof will be omitted.

Figure 16:
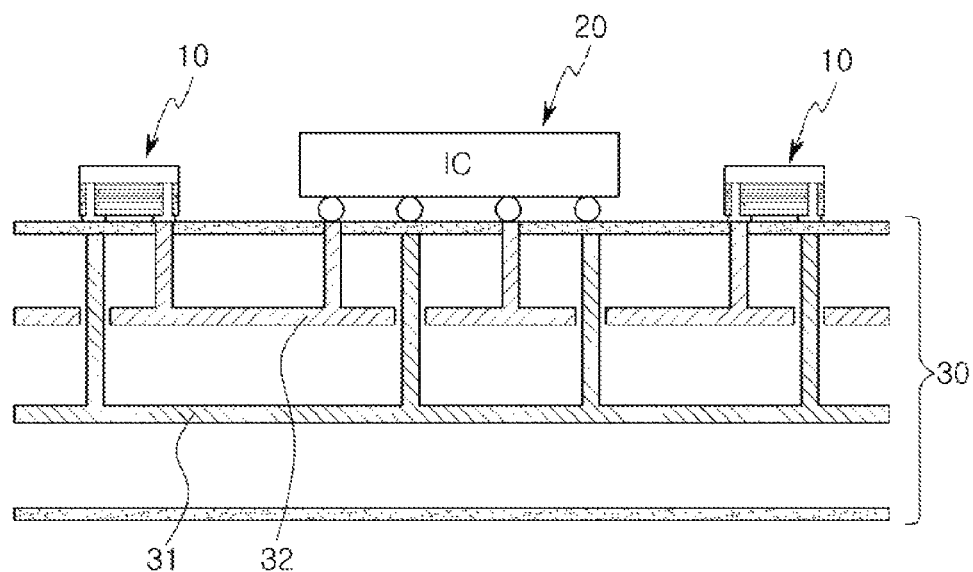
FIGS. 16-19 are cross-sectional views schematically illustrating various examples of circuit boards having electronic components.

FIG. 16 is a cross-sectional view schematically illustrating an example of a circuit board having an electronic component.

A circuit board having an electronic component according to an example may include a circuit board 30; an integrated circuit (IC) 20 mounted on the circuit board 30; and electronic components 10 mounted on the circuit board 30. Circuit patterns 31 and 32 may be formed on the circuit board 30, and the integrated circuit 20 and the electronic components 10 may be electrically connected to each other through the circuit patterns 31 and 32.

Hereinafter, the respective components constituting the circuit board having an electronic component according to an example will be described in more detail with reference to FIG. 16, and a description of contents overlapped with contents described above will be omitted.

The circuit board 30 may be a known printed circuit board (PCB). For example, the circuit board 30 may be a main board of an electronic apparatus, an interposer board of a package, or the like, but is not limited thereto. The first circuit pattern 31 may be a ground pattern (GND), the second circuit pattern 32 may be a power pattern (Power), and the electronic component 10 may be, for example, a capacitor, and may remove noise of ground and power networks of the integrated circuit 20, but is not limited thereto. The circuit board having an electronic component described above is only one of various examples, and the electronic component 10 according to the present disclosure (such as any of electronic components 10A-10D described above) may be mounted on the circuit board 30 in another form similar to the form described above and be variously used.

Figure 17:
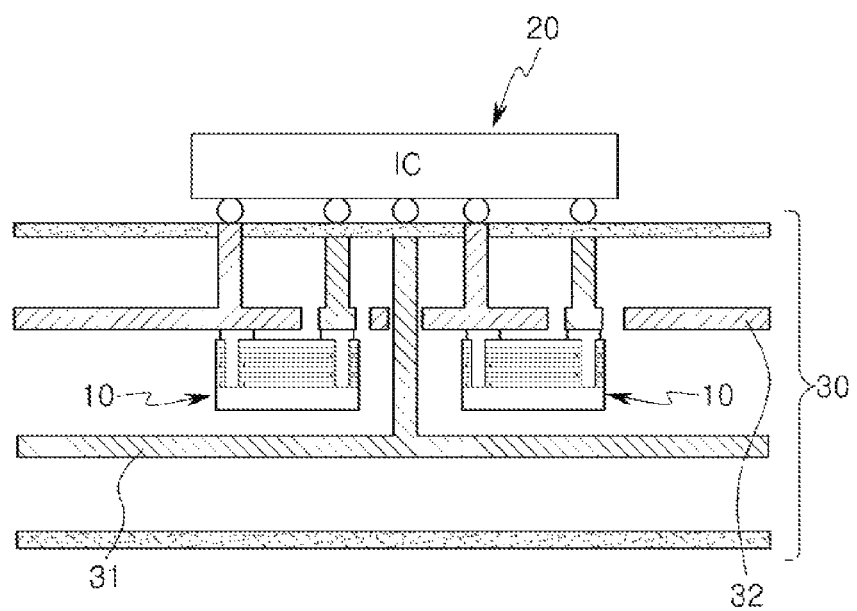

FIG. 17 is a cross-sectional view schematically illustrating an example of another circuit board having an electronic component.

A circuit board having an electronic component according to the example of FIG. 17 may include a circuit board 30; an integrated circuit (IC) 20 mounted on the circuit board 30; and electronic components 10 embedded in the circuit board 30. Circuit patterns 31 and 32 may be formed on the circuit board 30, and the integrated circuit 20 and the electronic components 10 may be electrically connected to each other through the circuit patterns 31 and 32.

Hereinafter, the respective components constituting the circuit board having an electronic component according to an example will be described in more detail with reference to FIG. 17, and a description of contents overlapped with contents described above will be omitted.

The circuit board 30 may be the known printed circuit board (PCB). For example, the circuit board 30 may be a main board of an electronic apparatus, an interposer board of a package, or the like, but is not limited thereto. The first circuit pattern 31 may be a ground pattern (GND), the second circuit pattern 32 may be a power pattern (Power), and the electronic component 10 may be embedded in the circuit board 30 as described above, may be, for example, a capacitor, and may remove noise of ground and power networks of the integrated circuit 20, but is not limited thereto. The circuit board having an electronic component described above is only one of various examples, and the electronic component 10 according to the present disclosure (such as any of electronic components 10A-10D described above) may be embedded in the circuit board 30 in another form similar to the form described above and may be variously used.

Figure 18:
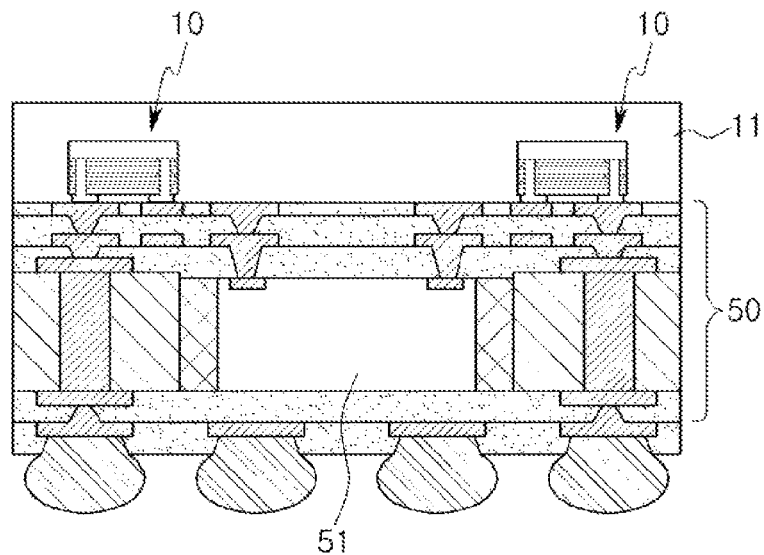

FIG. 18 is a cross-sectional view schematically illustrating an example of a semiconductor package having an electronic component.

A semiconductor package having an electronic component according to an example may include a semiconductor package 50; and electronic components 10 surface-mounted on the semiconductor package by a surface mount technology (SMT). The semiconductor package 50 may basically include a semiconductor chip 51, and the electronic components 10 may be mounted on the semiconductor package 50 and may be electrically connected to the semiconductor chip 51. The electronic components 10 may be encapsulated with and protected by the known molding material, for example an epoxy molding compound (EMC) or the like.

Hereinafter, the respective components constituting the semiconductor package having an electronic component according to an example will be described in more detail with reference to FIG. 18, and a description of contents overlapped with contents described above will be omitted.

The purpose of the semiconductor package 50 is to be mounted or embedded on or in a circuit board of an electronic apparatus through redistribution of electrode pads of the semiconductor chip 51, and the semiconductor chip 51 may be packaged in a face-down form as illustrated in FIG. 18 or be packaged in a face-up form unlike illustrated in FIG. 18. The electronic components 10 may be connected to a redistribution layer of the semiconductor package 50 to thereby be electrically connected to the semiconductor chip 51, may be a capacitor for example, and may remove noise of ground and power networks of the semiconductor chip 51, but is not limited thereto. The semiconductor package having an electronic component described above is only one of various examples, and the electronic component 10 according to the present disclosure (such as any of electronic components 10A-10D described above) may be mounted on the semiconductor package 50 in another form similar to the form described above and be variously used.

Figure 19:
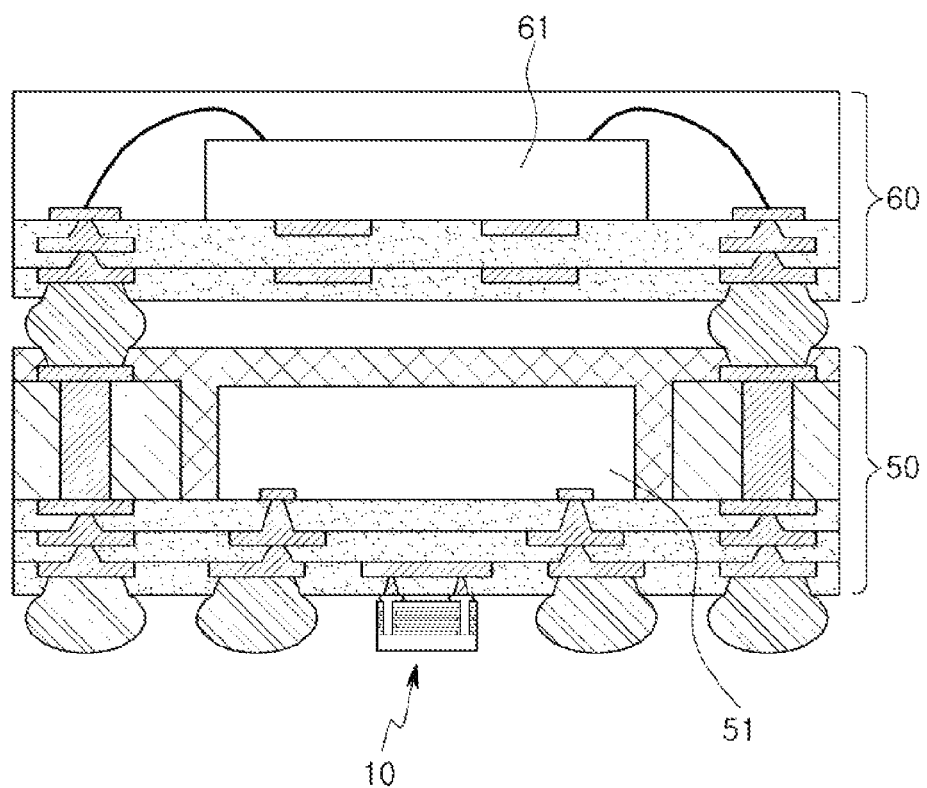

FIG. 19 is a cross-sectional view schematically illustrating another example of a semiconductor package having an electronic component.

A semiconductor package having an electronic component according to another example may include a first semiconductor package 50; a second semiconductor package 60 stacked on the first semiconductor package 50; and an electronic component 10 surface-mounted on a lower surface of the first semiconductor package 50 by a surface mount technology (SMT). The first semiconductor package 50 and the second semiconductor package 60 may basically include a first semiconductor chip 51 and a second semiconductor chip 61, respectively, and the electronic component 10 may be mounted on the lower surface of the first semiconductor package 50 and be electrically connected to the first semiconductor chip 51 and/or the second semiconductor chip 61.

Hereinafter, the respective components constituting the semiconductor package having an electronic component according to another example will be described in more detail with reference to FIG. 19, and a description of contents overlapped with contents described above will be omitted.

The purposes of the first semiconductor package 50 and the second semiconductor package 60 are to be mounted or embedded on or in a circuit board of an electronic apparatus through redistribution of electrode pads of the first semiconductor chip 51 and second semiconductor chip 61, and the first semiconductor chip 51 and second semiconductor chip 61 may be packaged in a face-down form as illustrated in FIG. 19 or be packaged in a face-up form unlike that illustrated in FIG. 19. The electronic component may be connected to a redistribution layer of the first semiconductor package 50 to thereby be electrically connected to the first semiconductor chip 51 and/or the second semiconductor chip 61, may be a capacitor for example, and may remove noise of ground and power networks of the first semiconductor chip 51, but is not limited thereto.

The first semiconductor chip 51 may be an application processor chip such as a central processor (for example, a central processing unit (CPU)), a graphics processor (for example, a graphics processing unit (GPU)), a digital signal processor, a cryptography processor, a micro-processor, a micro-controller, or the like, and the second semiconductor chip 61 may be a memory chip such as a volatile memory (for example, a dynamic random access memory (DRAM)), a non-volatile memory (for example, a read only memory (ROM), a flash memory, or the like. However, the first and second semiconductor chips 51 and 61 are not limited thereto.

The semiconductor package having an electronic component described above is only one of various examples, and the electronic component 10 according to the present disclosure (such as any of electronic components 10A-10D described above) may be mounted on the semiconductor package 50 in another form similar to the form described above and be variously used.

Terms "upper portion", "upper surface", "upper side", and the like, used in the present disclosure have been used to indicate a direction or position in relation to a direction that becomes distant from a substrate of the support part in the third direction for convenience. Similarly, terms "lower power", "lower surface", "lower side", and the like, used in the present disclosure have been used to indicate a direction or position in relation to a direction toward the substrate of the support part in the third direction for convenience. In addition, terms "side portion", "side surface", and the like, have been used in relation to any direction of the first direction or the second direction for convenience. However, these directions have been defined for convenience of explanation, and the scope of the present disclosure is not limited by the directions defined as described above.

In the present disclosure, the word "connected" refers to cases in which any component is indirectly connected to another component by an adhesive layer, or the like, as well as cases in which any component is directly connected to another component. In addition, a word "electrically connected" is a concept including both of a case in which any component is physically connected to another component and a case in which any component is not physically connected to another component but is nonetheless electrically connected thereto. In addition, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

The term "example" used in the present disclosure does not mean the same exemplary embodiment, but is provided in order to emphasize and describe different unique features. However, the above suggested examples may also be combined with features from other examples. For example, even though particulars described in a specific example are not described in another example, the particulars may be understood to apply or relate to the other example unless described otherwise.

Terms used in the present disclosure are used only in order to describe an exemplary embodiment rather than limiting the present disclosure. Here, singular forms include plural forms unless interpreted otherwise in a context.

As one of several effects of the present disclosure, a new electronic component capable of having a significantly reduced size and thickness while maintaining existing performance, and a method of manufacturing the same may be provided.

Here, in the new electronic component provided in the present disclosure, the vias may be formed after the metal layers and the dielectric layers are formed together without performing a separate patterning process, thereby electrically connecting the metal layers and the external electrodes to each other.

In addition, in the new electronic component provided in the present disclosure, the respective internal electrodes do not need to be drawn out to the air and be then formed using the photolithography or the shadow mask.

Further, in the new electronic component provided in the present disclosure, since the metal layers formed of heterogeneous materials may be connected to each other by one via, the metal layers used as the internal electrodes may be connected to the external electrodes through the via.

Further, in the new electronic component provided in the present disclosure, since the metal layers used as the internal electrodes are connected to the external electrodes through the vias formed in the body, stress applied to the external electrodes is not concentrated in one direction, but may be dispersed.

Further, in the new electronic component provided in the present disclosure, since a separate process of processing side surfaces of the body is not required, a process in a wafer unit rather than a chip unit is possible.

While exemplary embodiments have been shown and described above, it will be apparent to those skilled in the art that modifications and variations could be made without departing from the scope of the present invention as defined by the appended claims.

What is claimed is:

1. An electronic component comprising:
a body part including first and second metal layers disposed with at least one dielectric layer interposed between the first and second metal layers; and
a via part disposed in the body part and including first and second vias penetrating through the body part and selectively connected to the first and second metal layers, respectively,
wherein the first and second metal layers contain different metals, and
wherein the body part includes:
a first insulating film disposed between the first metal layer and the second via; and
a second insulating film disposed between the second metal layer and the first via.

2. The electronic component of claim 1, wherein the first via is electrically insulated from the second metal layer by the second insulating film, and
the second via is electrically insulated from the first metal layer by the first insulating film.

3. The electronic component of claim 1, wherein the first insulating film is disposed on a same layer as the first metal layer and encloses the second via, and
the second insulating film is disposed on a same layer as the second metal layer and encloses the first via.

4. The electronic component of claim 1, wherein a corner of a surface of the first insulating film contacting the first metal layer and a corner of a surface of the second insulating film contacting the second metal layer have a rounded shape.

5. The electronic component of claim 1, wherein the first and second metal layers contain aluminum (Al) and copper (Cu) respectively, chromium (Cr) and copper (Cu) respectively, chromium (Cr) and gold (Au) respectively, copper (Cu) and aluminum (Al) respectively, copper (Cu) and chromium (Cr) respectively, copper (Cu) and nickel (Ni) respectively, copper (Cu) and titanium (Ti) respectively, copper (Cu) and tungsten (W) respectively, gold (Au) and chromium (Cr) respectively, gold (Au) and titanium (Ti) respectively, nickel (Ni) and copper (Cu) respectively, nickel (Ni) and titanium (Ti) respectively, titanium (Ti) and copper (Cu) respectively, titanium (Ti) and gold (Au) respectively, titanium (Ti) and nickel (Ni) respectively, titanium (Ti) and tungsten (W) respectively, tungsten (W) and copper (Cu) respectively, tungsten (W) and titanium (Ti) respectively, or titanium (Ti) and nickel (Ni) respectively.

6. The electronic component of claim 1, wherein the at least one dielectric layer contains at least one of a barium titanate (BT)-based ceramic powder and a strontium barium titanate (SBT)-based ceramic powder.

7. The electronic component of claim 1, further comprising an electrode part disposed on the body part and including first and second external electrodes connected to the first and second vias, respectively.

8. The electronic component of claim 7, wherein the body part further includes an insulating layer formed as an outermost surface thereof, and
the first and second external electrodes are disposed on the insulating layer so as to be spaced apart from each other.

9. The electronic component of claim 1, further comprising a support part including a substrate disposed on one side of the body part and supporting the body part.

10. The electronic component of claim 1, wherein the electronic component is a thin film capacitor, and
the first and second metal layers are first and second internal electrodes, respectively.

11. The electronic component of claim 1, wherein the first via penetrating through the body part has a different size than the second via penetrating through the body part.

12. The electronic component of claim 1, wherein the first via includes a plurality of vias each penetrating through the first and second metal layers and the at least one dielectric layer of the body part and each electrically connected to the first metal layers, and the second via includes a plurality of vias each penetrating through the first and second metal layers and the at least one dielectric layer of the body part and each electrically connected to the second metal layers.

* * * * *